(12) United States Patent
Mancuso (10) Patent No.: US 7,630,699 B2
(45) Date of Patent: Dec. 8, 2009

(54) SYSTEMS AND METHODS OF SCALE MODEL CORRECTION TO ACCOUNT FOR ANTENNA COUPLING LOSS

(75) Inventor: Vincent Mancuso, Cinnaminson, NJ (US)

(73) Assignee: The Boeing Company, Chicago, IL (US)

( * ) Notice: Subject to any disclaimer, the term of this patent is extended or adjusted under 35 U.S.C. 154(b) by 556 days.

(21) Appl. No.: 11/613,038

(22) Filed: Dec. 19, 2006

(65) Prior Publication Data

US 2008/0143617 A1    Jun. 19, 2008

(51) Int. Cl.
*H04B 7/00* (2006.01)

(52) U.S. Cl. ............ 455/277.1; 455/269; 455/277.2; 455/280; 343/703; 343/853

(58) Field of Classification Search .......... 455/269–289; 343/703, 705, 708, 725, 729, 737, 751, 816, 343/814, 820, 844, 850, 853, 865, 893
See application file for complete search history.

(56) References Cited

U.S. PATENT DOCUMENTS

| | | | | |
|---|---|---|---|---|
| 4,538,153 | A * | 8/1985 | Taga | 455/277.1 |
| 5,875,391 | A * | 2/1999 | Riley et al. | 455/295 |
| 6,456,257 | B1 * | 9/2002 | Zamat | 343/876 |
| 6,583,767 | B1 * | 6/2003 | Fitz | 455/277.1 |
| 6,894,653 | B2 * | 5/2005 | Chiang et al. | 455/269 |
| 7,253,783 | B2 * | 8/2007 | Chiang et al. | 343/853 |
| 7,443,343 | B2 * | 10/2008 | Schlegel et al. | 343/702 |
| 2002/0193071 | A1 * | 12/2002 | Waltho | 455/278.1 |
| 2008/0258981 | A1 * | 10/2008 | Achour et al. | 343/702 |

* cited by examiner

Primary Examiner—Lana N Le
(74) Attorney, Agent, or Firm—Rozenblat IP LLC (57) ABSTRACT

The invention relates to systems and methods which may allow the determination of a correction factor between full scale antennas and scale antennas in order to determine the coupling loss of the full scale antennas on full scale structures based on models of the full scale structures.

23 Claims, 7 Drawing Sheets

SYSTEMS AND METHODS OF SCALE MODEL CORRECTION TO ACCOUNT FOR ANTENNA COUPLING LOSS

STATEMENT OF GOVERNMENT RIGHTS

This invention was made with Government support under contract N00019-93C-006 awarded by the United States Navy. The government has certain rights in this invention.

BACKGROUND OF THE INVENTION

On large structures such as aircraft, power coupled between antennas is often the primary cause of spurious responses in a receiver. Antenna coupling can be predicated analytically or experimentally. In the late 1960's, a coupling loss study for aircraft was performed by the University of Michigan. Equations and graphs from that study have been used to approximate coupling loss. However, the method is generally only accurate for far field conditions. Numerical electromagnetic codes such as those based on Finite Difference Time-Domain have also been used to characterize antenna performance. However, excessive computer memory and run times can make them expensive to use.

Aircraft geometric scale modeling is another method for studying coupling loss between antennas. These models simulate the electromagnetic fields that are on the full scale (or full sized) structure. These models are useful for studying the coupling loss between the collocated antennas on the full scale structures. To predicate the coupling loss on the full scale structure, it would be helpful to determine the correction factor between the full scale antennas and the scale antennas so that the scale model data can be adjusted accordingly.

Systems and methods are needed which determine the correction factor between full scale antennas and scale antennas in order to determine the coupling loss of the full scale antennas on the full scale structures based on models of the full scale structures.

SUMMARY OF THE INVENTION

In one aspect of the invention, a method of approximating a first coupling loss between at least two antennas on a structure is provided. In one step, a reduced sized model of the structure is formed. The reduced sized model is reduced in size from the structure by a scaling factor. In another step, at least two reduced sized model antennas are formed of the at least two antennas. The at least two reduced sized model antennas are reduced in size from the at least two antennas by the scaling factor. In another step, the at least two reduced sized model antennas are located on the reduced sized model. In yet another step, a second coupling loss is measured between the at least two reduced sized model antennas while located on the reduced sized model. In still another step, a correction factor is determined. In another step, the correction factor is applied to the second coupling loss to approximate the first coupling loss between the at least two antennas while on the structure.

In another aspect of the invention, a method of approximating a first coupling loss between at least two antennas on a structure is provided. In one step, a reduced sized model of the structure is formed. The reduced sized model is reduced in size from the structure by a scaling factor. In another step, at least two reduced sized model antennas are formed of the at least two antennas. The at least two reduced sized model antennas are reduced in size from the at least two antennas by the scaling factor. In another step, the at least two reduced sized model antennas are located on the reduced sized model. In yet another step, a second coupling loss is measured between the at least two reduced sized model antennas while located on the reduced sized model. In still another step, a third coupling loss is measured between the at least two reduced size model antennas while located off the reduced sized model. In an additional step, a fourth coupling loss is measured between the at least two antennas while located off the structure. In yet another step, the first coupling loss between the at least two antennas while on the structure is approximated by adding the fourth coupling loss to the second coupling loss and subtracting the third coupling loss.

In a further aspect of the invention, a method of approximating a first coupling loss between at least two antennas on a structure is provided. In one step, a reduced sized model of the structure is formed. The reduced sized model is reduced in size from the structure by a scaling factor. In another step, at least two reduced sized model antennas of the at least two antennas are formed. The at least two reduced sized model antennas are reduced in size from the at least two antennas by the scaling factor. In an additional step, the at least two reduced sized model antennas are located on the reduced sized model. In still another step, a second coupling loss is measured between the at least two reduced sized model antennas while located on the reduced sized model. In another step, gains are separately measured of each of the at least two reduced sized model antennas while each is independently installed at an identical fixed-point location on an antenna ranges turn table which is setup at a distance away from an antenna ranges calibrated source. In an additional step, gains are separately measured of each of the at least two antennas while each is independently installed at the identical fixed-point location on the antenna ranges turn table setup at the distance away from the antenna ranges calibrated source. In yet another step, the first coupling loss between the at least two antennas while on the structure is approximated by adding each of the separately measured gains of each of the at least two antennas to the second coupling loss and subtracting each of the separately measured gains of each of the at least two reduced sized model antennas.

These and other features, aspects and advantages of the invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

When two antennas are collocated on a structure such as an aircraft or other vehicle, energy radiating from one antenna on the structure is induced into another antenna on the structure. Coupling loss is a parameter that characterizes the gain of the two antennas and the spatial loss between the antennas.

A geometrical scale model of the structure can approximate the distribution of electric fields resulting from the antennas on the full size structure. To model the structure, the dimensions of the structure may be reduced by a scaling factor n in order to produce a model of the structure. The dimensions of the antennas on the structure may then reduced by the same scaling factor n in order to produce model antennas on the model of the structure. The full scale frequencies of the structure may be reduced by the same scaling factor n in order to produce the test frequencies of the scale model. However, since material properties are difficult to scale, a correction factor must be estimated which may be applied to the antenna coupling loss data that is measured on the scale model in order to approximate the coupling loss of the structure.

Figure 1:
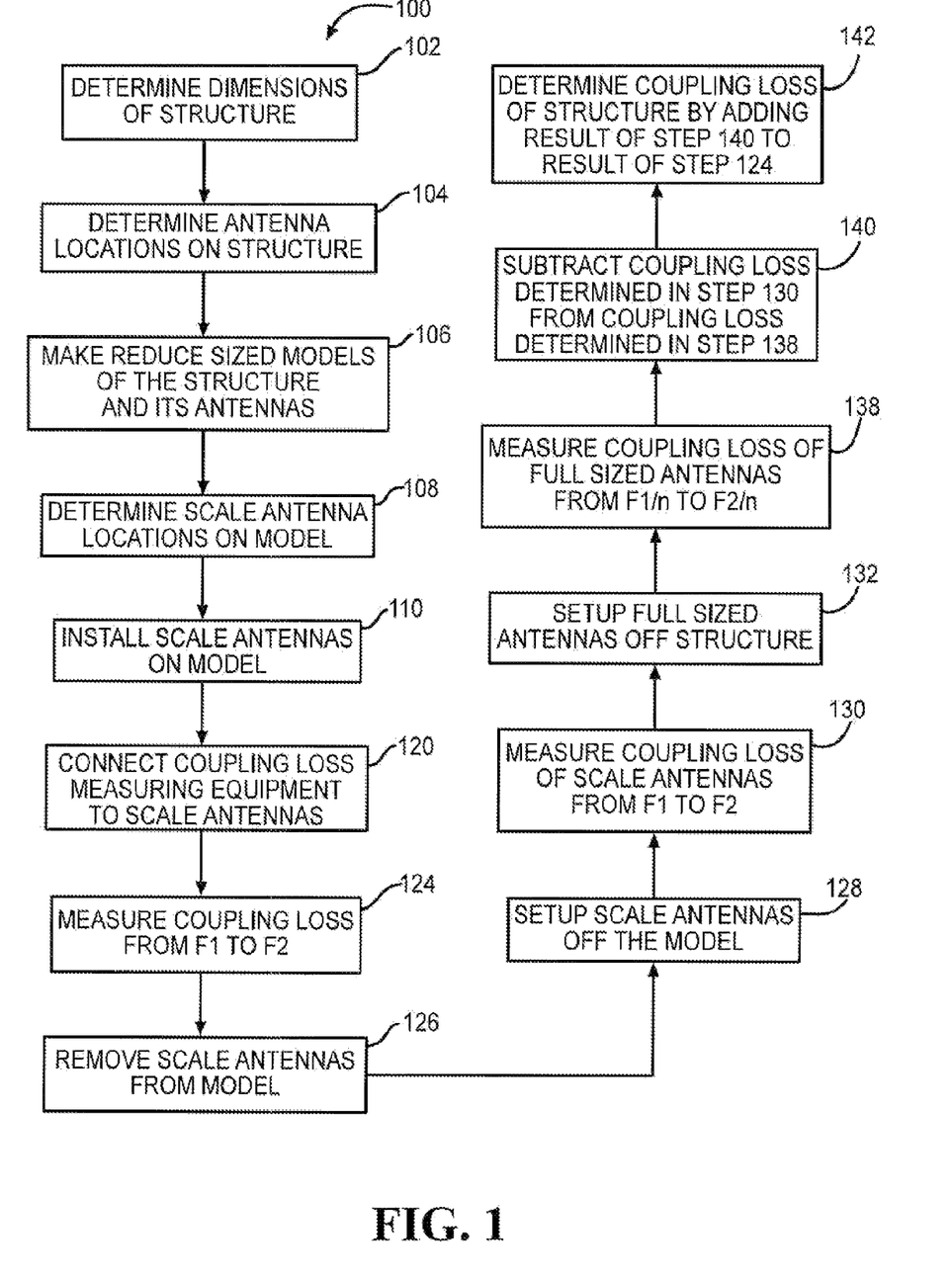
FIG. 1 depicts a flowchart showing one embodiment of a method for determining antenna coupling loss on a structure.
Figure 2:
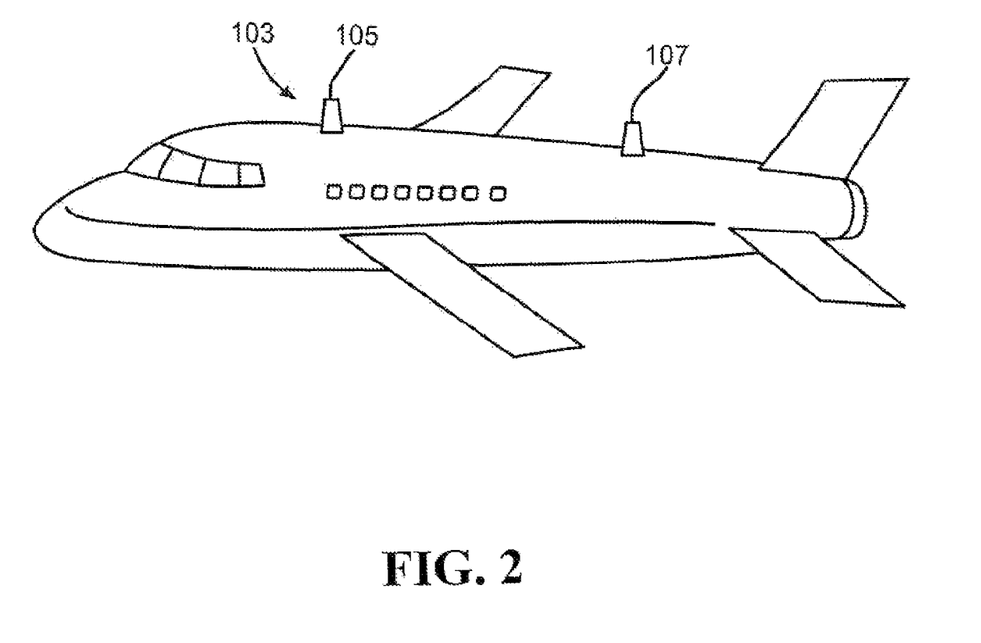
FIG. 2 depicts a front view of one embodiment of a full-sized (full-scale) structure with full-sized (full-scale) antennas located on the structure.
Figure 3:
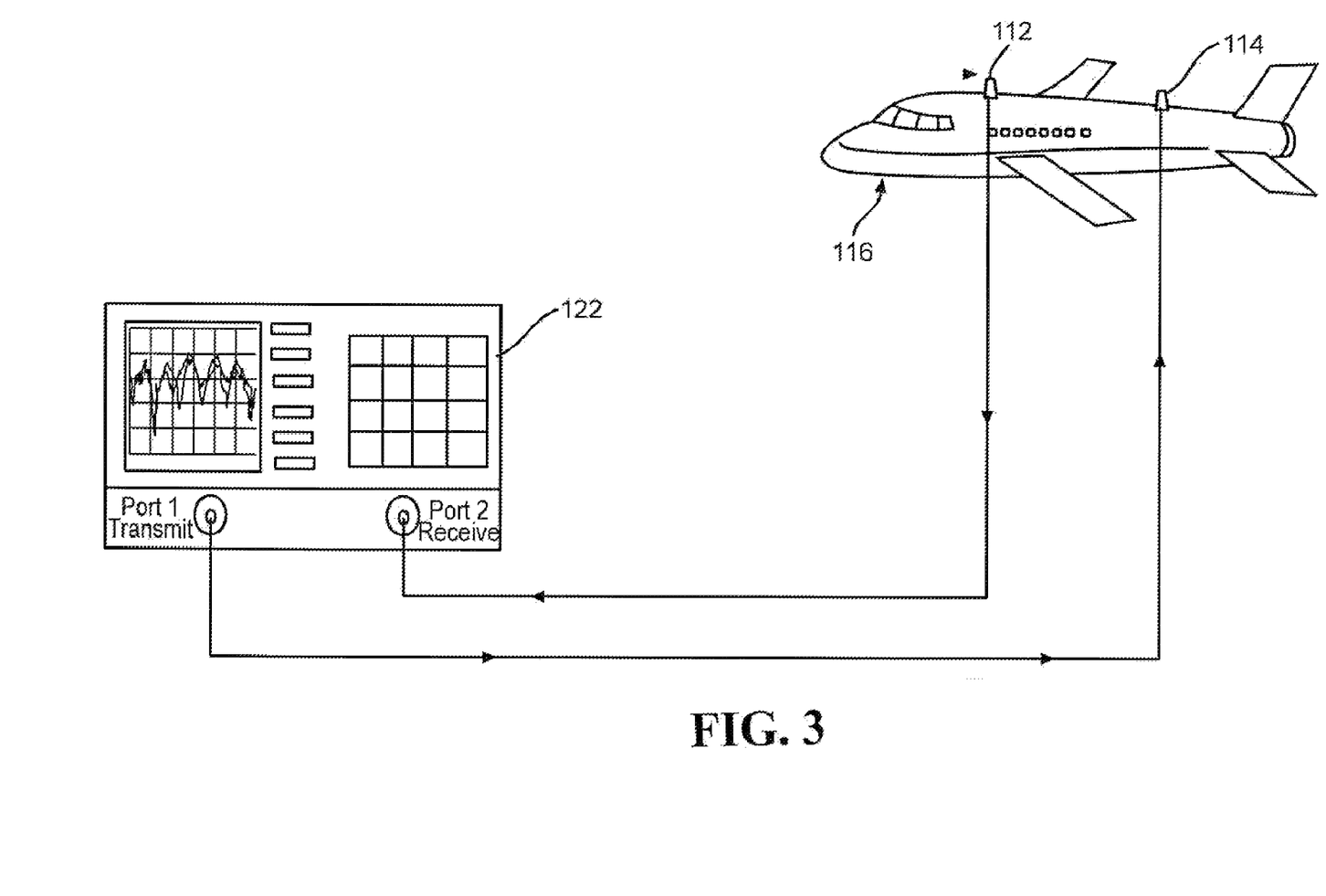
FIG. 3 depicts a front view of one embodiment of reduced sized models of the full-sized structure and antennas of FIG. 2.

FIG. 1 depicts a flowchart 100 showing one embodiment of a method for determining antenna coupling loss on a structure 103. As shown in FIG. 2, the structure 103 (also referred to as full-sized or full-scale structure) may be a vehicle such as an aircraft, helicopter, or other type of structure having two antennas 105 and 107 (also referred to as full-sized antennas or full-scale antennas). In step 102, the dimensions of the full scale structure 103 may be determined. In step 104, the antenna locations of the two antennas 105 and 107 on the structure 103 may be determined. In step 106, as shown in FIG. 3, a model 116 of the structure 103 (also referred to as a reduced sized or reduced scale model of the structure) and model antennas 112 and 114 (also referred to as reduced sized model antennas) modeling the full-size antennas 105 and 107 may be made by dividing the dimensions of the full scale structure 103 and full-size antennas 105 and 107 by a scaling factor n in order to produce the reduced size model 116 of the structure 103 and reduced size model antennas 112 and 114. In step 108, the full scale (or full sized) antenna coordinates on the structure 103 may be divided by the scaling factor n in order to determine the antenna locations of the model antennas 112 and 114 on the scale model 116.

In step 110, as shown in FIG. 3, the model antennas 112 and 114 may be installed on the scale model 116 at the antenna locations determined in step 108. In step 120, coupling loss measuring equipment may be connected to the model antennas 112 and 114 (or scale antennas). FIG. 3 depicts a network analyzer 122, which is adapted to measure coupling loss, connected to the model antennas 112 and 114 which are installed on the scale model 116 of the aircraft. In step 124, the coupling loss may be measured from the start frequency F1 for the scale model measurement to the stop frequency F2 for the scale model measurement.

Figure 4:
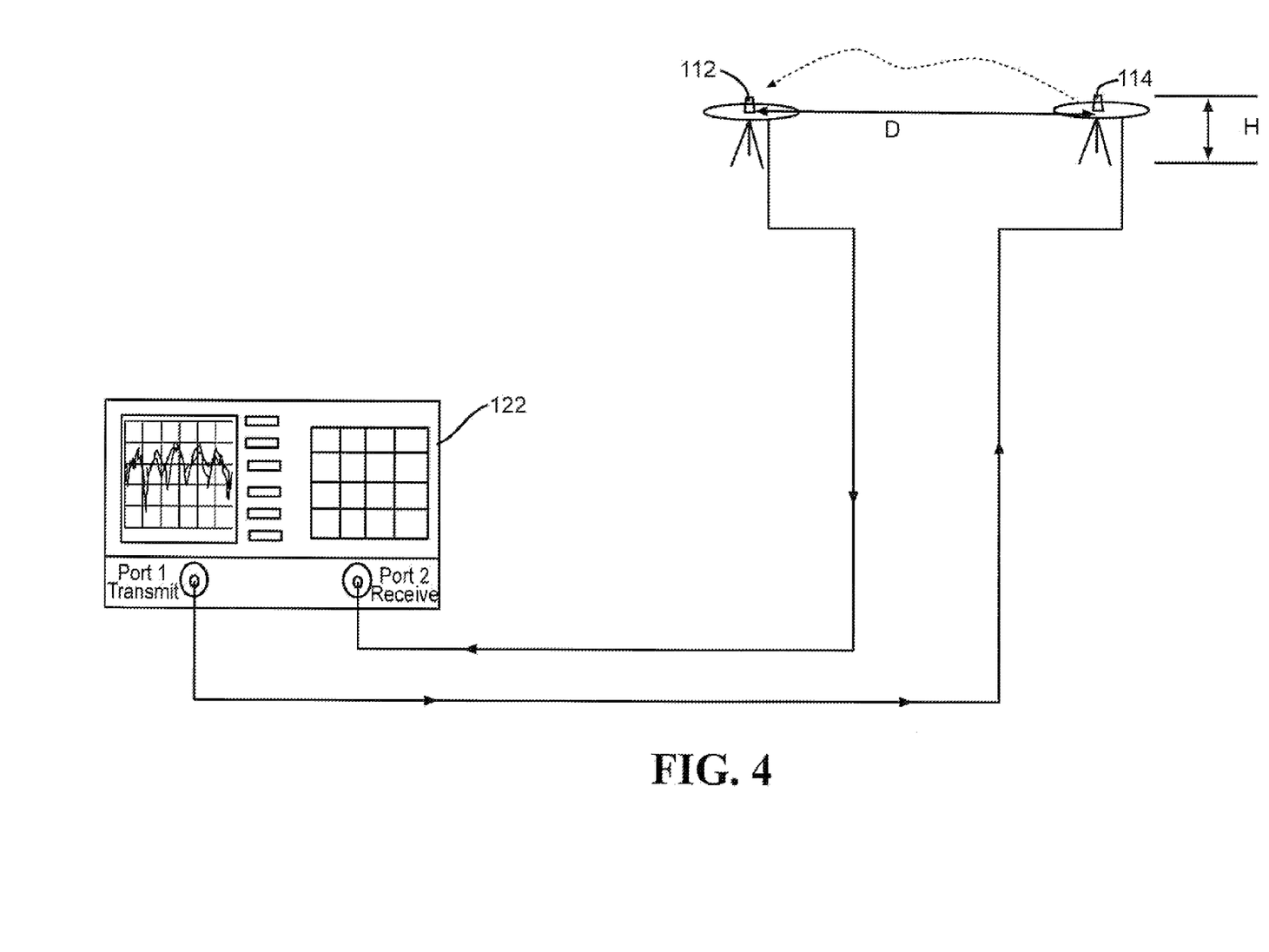
FIG. 4 depicts a front view of the reduced sized model antennas of FIG. 3 setup off the scale model of the structure.

In step 126, the scale antennas 112 and 114 may be removed from the model 116. In step 128, as shown in FIG. 4, the scale antennas 112 and 114 may be setup off the scale model 116 at a distance apart D, at a height above ground H, while the network analyzer 122 is connected to the scale antennas 112 and 114. The distance apart D and the height above ground H may be of varying dimensions. In step 130, the coupling loss measuring equipment 122 may be used to measure the coupling loss between the model antennas 112 and 114 from the start frequency F1 for the scale model measurement to the stop frequency F2 for the scale model measurement.

Figure 5:
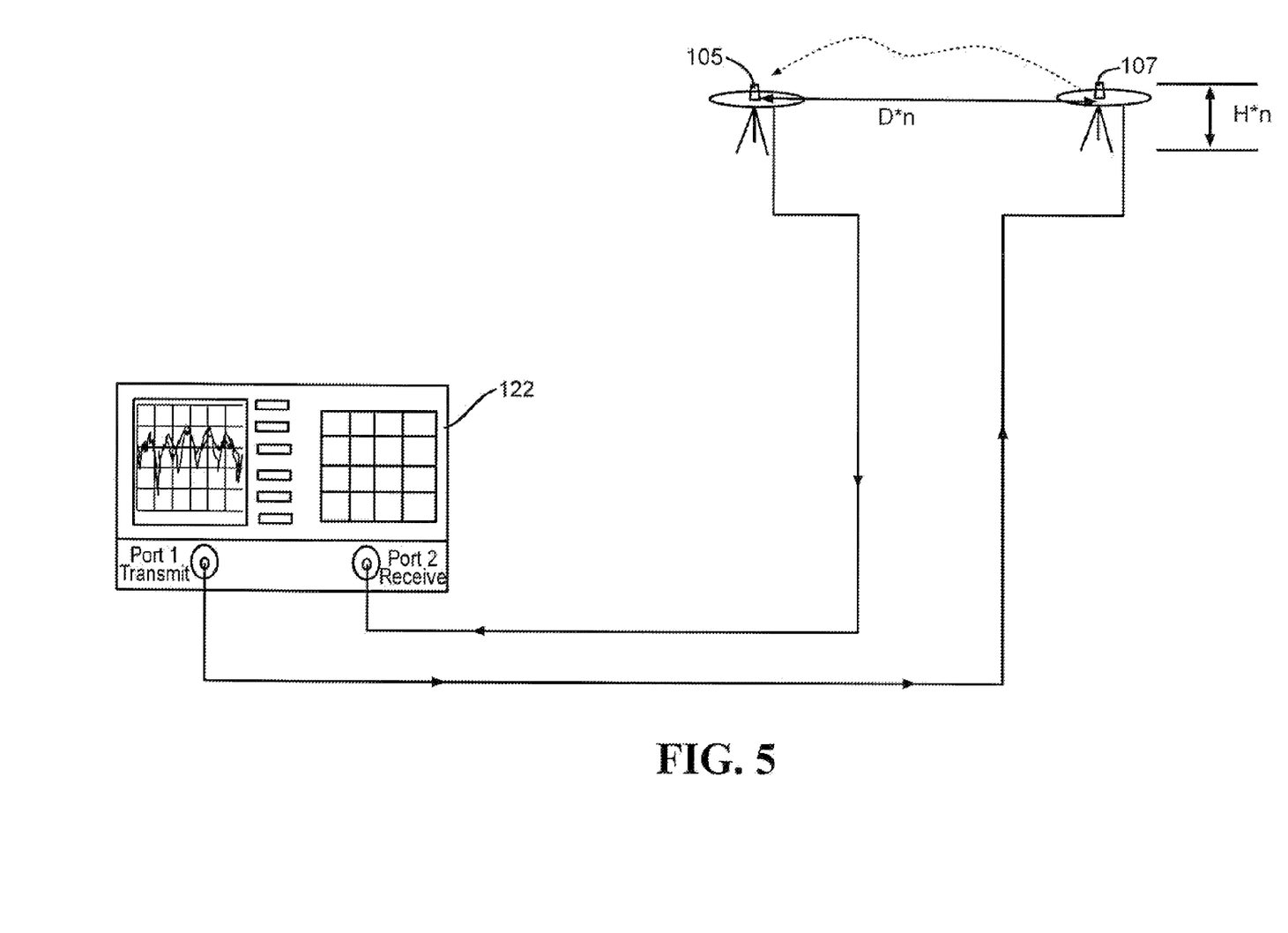
FIG. 5 depicts a front view of the full scale (or full sized) antennas of FIG. 2 setup off the full-scale structure.

In step 132, as shown in FIG. 5, the full scale antennas 105 and 107 may be setup off the structure 103 at a distance apart of D multiplied by the scaling factor n, and at a height off the ground of H multiplied by the scaling factor n, while the network analyzer 122 is connected to the full scale antennas 105 and 107. In step 138, the coupling loss between the full scale antennas 105 and 107 may be measured from a starting frequency of F1 divided by the scaling factor n to the stop frequency of F2 divided by the scaling factor n.

In step 140, the measured coupling loss of the model antennas 112 and 114 off the model 116, as determined in step 130, may be subtracted from the measured coupling loss of the full scale antennas 105 and 107 off the structure 103, as determined in step 138, in order to determine a correction factor. In step 142, the coupling loss subtraction result of step 140 (the correction factor) may be added to the measured coupling loss of the antennas 112 and 114 on the scale model 116, as determined in step 124, in order to determine the estimated antenna coupling loss on the structure 103 from the start frequency of F1 divided by the scaling factor n to the stop frequency of F2 divided by the scaling factor n. In such manner, the use of the correction factor may allow for the approximation of the antenna coupling loss on the structure 103.

Figure 6:
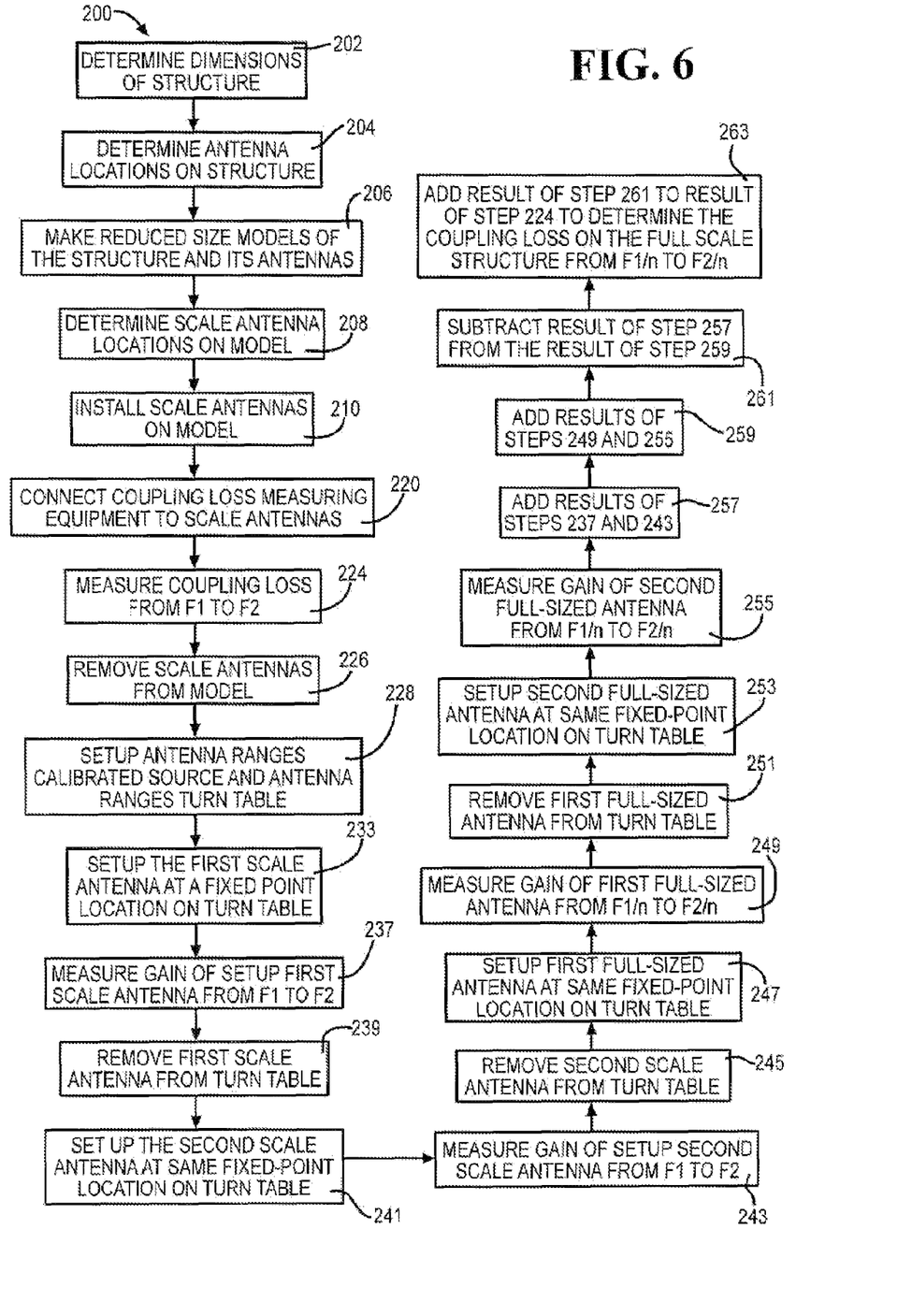
FIG. 6 depicts a flowchart showing another embodiment of a method for determining antenna coupling loss on a structure.

FIG. 6 depicts a flowchart 200 showing another embodiment of a method for determining antenna coupling loss on a structure 103. As shown in FIG. 2, the structure 103 may be a vehicle such as an aircraft, helicopter, or other type of structure having two antennas 105 and 107. In step 202, the dimensions of the full scale structure 103 may be determined. In step 204, the antenna locations of the two antennas 105 and 107 on the structure 103 may be determined. In step 206, as shown in FIG. 3, a model 116 of the structure 103 and model antennas 112 and 114 of the full-size antennas 105 and 107 may be made by dividing the dimensions of the full scale structure 103 and full-size antennas 105 and 107 by a scaling factor n in order to produce the reduced size model 116 of the structure 103 and reduced size model antennas 112 and 114. In step 208, the full scale antenna coordinates on the structure 103 may be divided by the scaling factor n in order to determine the antenna locations of the model antennas 112 and 114 on the scale model 116.

In step 210, as shown in FIG. 3, the model antennas 112 and 114 may be installed on the scale model 116 at the antenna locations determined in step 208. In step 220, coupling loss measuring equipment may be connected to the model antennas 112 and 114 (or scale antennas). FIG. 3 depicts a network analyzer 122, which is adapted to measure coupling loss, connected to the model antennas 112 and 114 which are installed on the scale model 116 of the aircraft. In step 224, the coupling loss may be measured from the start frequency F1 for the scale model measurement to the stop frequency F2 for the scale model measurement.

Figure 7:
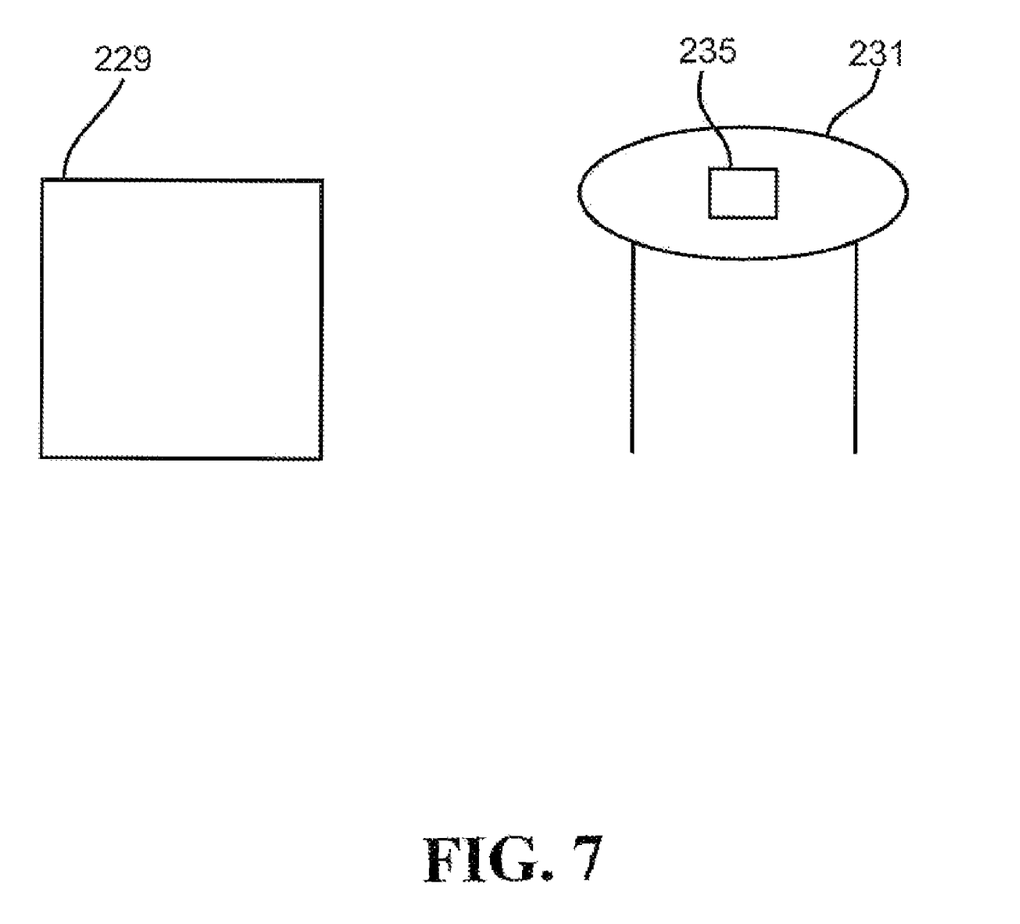
FIG. 7 depicts a front view of one embodiment of an antenna ranges calibrated source and antenna ranges turn table setup relative to one another in known relationships to provide a known field at the table.

In step 226, the scale antennas 112 and 114 may be removed from the model 116. In step 228, as shown in FIG. 7, an antenna ranges calibrated source 229 and antenna ranges turn table 231 may be setup relative to one another in known relationships to provide a known field (emitting from the source 229) at the table 231. Antenna ranges are facilities for testing and evaluating antennas. Compact ranges, anechoic ranges, far-field ranges, and near-field ranges are examples of antenna ranges. Regardless of the type of range, they are all capable of measuring an antenna's gain as a function of aspect angle. Each range has defined procedures for determining the gain of an antenna. In such manner, the antenna ranges source 229 may be calibrated with respect to the antenna ranges turn table 231.

In step 233, scale antenna 112 may be setup at fixed-point location 235 on turn table 231. The fixed-point location 235 may be on any part of the turn table 231 as long as the location of the fixed-point is known. A mounting fixture may be used to mount the scale antenna 112 on the table 231. The mounting fixture may be a variety of shapes, sizes, orientations, and configurations. In step 237, the gain of scale antenna 112 may be measured from the start frequency F1 for the scale model measurement to the stop frequency F2 for the scale model measurement. In step 239, scale antenna 112 may be removed from the table 231.

In step 241, scale antenna 114 may be setup at the same fixed-point location 235 on turn table 231. It is important that the scale antenna 114 be setup at the exact location 235 as the scale antenna 112 was setup, in exactly the same orientation and configuration. The same mounting fixture should be used to mount the scale antenna 114 on the table 231 as was used to mount scale antenna 112. The mounting fixture may be a variety of shapes, sizes, orientations, and configurations. In step 243, the gain of scale antenna 114 may be measured from the start frequency F1 for the scale model measurement to the stop frequency F2 for the scale model measurement. In step 245, scale antenna 114 may be removed from the table 231.

In step 247, full-sized antenna 105 may be setup at the same fixed-point location 235 on turn table 231. It is important that the full-sized antenna 105 be setup at the exact location 235 as the scale antennas 112 and 114 were setup, in exactly the same orientation and configuration. A mounting fixture may be used to mount the full-sized antenna 105 on the table 231 which is larger by the scaling factor n of than the size of the mounting fixture which was used to mount scale antennas 112 and 114. In step 249, the gain of full-sized antenna 105 may be measured from the start frequency of F1 divided by the scaling factor n to the stop frequency of F2 divided by the scaling factor n. In step 251, full-sized antenna 105 may be removed from the table 231.

In step 253, full-sized antenna 107 may be setup at the same fixed-point location 235 on turn table 231. It is important that the full-sized antenna 107 be setup at the exact location 235 as the scale antennas 112 and 114 and the full-sized antenna 105 were setup, in exactly the same orientation and configuration. The same mounting fixture may be used to mount the full-sized antenna 107 on the table 231 as was used to mount full-sized antenna 105. In step 255, the gain of full-sized antenna 107 may be measured from the start frequency of F1 divided by the scaling factor n to the stop frequency of F2 divided by the scaling factor n.

In step 257, the gains of scale antennas 112 and 114, as determined in steps 237 and 243, may be added. In step 259, the gains of full-sized antennas 105 and 107, as determined in steps 249 and 255, may be added. In step 261, the combined gains of scale antennas 112 and 114, as determined in step 257, may be subtracted from the combined gains of full-sized antennas 105 and 107, as determined in step 259, in order to determine the correction factor. In step 263, the result of step 261 (the correction factor) may be added to the coupling loss result which was determined in step 224 for the model antennas 112 and 114 installed on the scale model 116. The result of step 263 may determine the coupling loss on the full scale structure 103 from the start frequency of F1 divided by the scaling factor n to the stop frequency of F2 divided by the scaling factor n. In such manner, the use of the correction factor may allow for the approximation of the antenna coupling loss on the structure 103.

In other embodiments, the above disclosed methods may be utilized to determine antenna loss on varying types of structures having varying number of antennas in varying configurations, locations, and orientations. This may be accomplished by repeating the steps of the methods for each additional antenna. In still other embodiments, one ore more steps of the above disclosed methods may be altered and/or additional steps added.

The systems and methods of the invention may allow the determination of a correction factor between the full scale antennas 105 and 107 and the scale antennas 112 and 114 in order to determine the coupling loss of the full scale antennas 105 and 107 on the full scale structure 103 based on the model 116.

It should be understood, of course, that the foregoing relates to exemplary embodiments of the invention and that modifications may be made without departing from the spirit and scope of the invention as set forth in the following claims.

I claim:

1. A method of approximating a first coupling loss between at least two antennas on a structure comprising:
   forming a reduced sized model of the structure, wherein the reduced sized model is reduced in size from the structure by a scaling factor;
   forming at least two reduced sized model antennas of the at least two antennas, wherein the at least two reduced sized model antennas are reduced in size from said at least two antennas by said scaling factor;
   locating said at least two reduced sized model antennas on said reduced sized model;
   measuring a second coupling loss between said at least two reduced sized model antennas while located on said reduced sized model;
   determining a correction factor; and
   applying said correction factor to said second coupling loss to approximate said first coupling loss between said at least two antennas while on said structure.

2. The method of claim 1 wherein said structure is at least one of a vehicle and an aircraft.

3. The method of claim 1 wherein the step of locating said at least two reduced sized model antennas on said reduced sized model comprises determining locations of said at least two antennas on said structure and dividing said locations by said scaling factor.

4. The method of claim 1 wherein a network analyzer is used to measure said second coupling loss.

5. The method of claim 1 wherein said second coupling loss is measured from a start frequency to a stop frequency.

6. The method of claim 1 wherein the step of determining a correction factor comprises:
   measuring a third coupling loss between said at least two reduced size model antennas while located off said reduced sized model;
   measuring a fourth coupling loss between said at least two antennas while located off said structure; and
   determining the correction factor by subtracting the third coupling loss from the fourth coupling loss.

7. The method of claim 6 wherein the step of applying said correction factor to said second coupling loss to approximate said first coupling loss between said at least two antennas while on said structure comprises adding said correction factor to said second coupling loss.

8. The method of claim 6 wherein during the step of measuring said third coupling loss, said at least two reduced sized model antennas are setup at a distance apart and at a height above ground, and during the step of measuring said fourth coupling loss, said at least two antennas are setup at said distance apart multiplied by the scaling factor and at said height above ground multiplied by the scaling factor.

9. The method of claim 8 wherein said second coupling loss is measured from a start frequency to a stop frequency, during the step of measuring said third coupling loss, said third coupling loss is measured from said same start frequency to said same stop frequency, and during the step of measuring said fourth coupling loss, said fourth coupling loss is measured from said start frequency divided by the scaling factor to said stop frequency divided by the scaling factor.

10. The method of claim 6 wherein said second coupling loss is measured from a start frequency to a stop frequency, during the step of separately measuring the gains of each of said at least two reduced sized model antennas the measurements are taken from said same start frequency to said same stop frequency, and during the step of separately measuring the gains of each of said at least two antennas the measurements are taken from said start frequency divided by the scaling factor to said stop frequency divided by the scaling factor.

11. The method of claim 1 wherein the step of determining a correction factor comprises:
separately measuring gains of each of said at least two reduced sized model antennas while each is independently installed at an identical fixed-point location on an antenna ranges turn table which is setup at a distance away from an antenna ranges calibrated source;
separately measuring gains of each of said at least two antennas while each is independently installed at said identical fixed-point location on said antenna ranges turn table setup at said distance away from said antenna ranges calibrated source; and
determining the correction factor by subtracting each of said separately measured gains of each of said at least two reduced sized model antennas from each of said separately measured gains of each of said at least two antennas.

12. The method of claim 11 wherein the step of applying said correction factor to said second coupling loss to approximate said first coupling loss between said at least two antennas while on said structure comprises adding said correction factor to said second coupling loss.

13. A method of approximating a first coupling loss between at least two antennas on a structure comprising:
forming a reduced sized model of the structure, wherein the reduced sized model is reduced in size from the structure by a scaling factor;
forming at least two reduced sized model antennas of the at least two antennas, wherein the at least two reduced sized model antennas are reduced in size from said at least two antennas by said scaling factor;
locating said at least two reduced sized model antennas on said reduced sized model;
measuring a second coupling loss between said at least two reduced sized model antennas while located on said reduced sized model;
measuring a third coupling loss between said at least two reduced size model antennas while located off said reduced sized model;
measuring a fourth coupling loss between said at least two antennas while located off said structure; and
approximating said first coupling loss between said at least two antennas while on the structure by adding said fourth coupling loss to the second coupling loss and subtracting the third coupling loss.

14. The method of claim 13 wherein said structure is at least one of a vehicle and an aircraft.

15. The method of claim 13 wherein the step of locating said at least two reduced sized model antennas on said reduced sized model comprises determining locations of said at least two antennas on said structure and dividing said locations by said scaling factor.

16. The method of claim 13 wherein a network analyzer is used to measure said second coupling loss, said third coupling loss, and said fourth coupling loss.

17. The method of claim 13 wherein said second coupling loss is measured from a start frequency to a stop frequency, said third coupling loss is measured from said same start frequency to said same stop frequency, and said fourth coupling loss is measured from said start frequency divided by the scaling factor to said stop frequency divided by the scaling factor.

18. The method of claim 13 wherein during the step of measuring said third coupling loss, said at least two reduced sized model antennas are setup at a distance apart and at a height above ground, and during the step of measuring said fourth coupling loss, said at least two antennas are setup at said distance apart multiplied by the scaling factor and at said height above ground multiplied by the scaling factor.

19. A method of approximating a first coupling loss between at least two antennas on a structure comprising:
forming a reduced sized model of the structure, wherein the reduced sized model is reduced in size from the structure by a scaling factor;
forming at least two reduced sized model antennas of the at least two antennas, wherein the at least two reduced sized model antennas are reduced in size from said at least two antennas by said scaling factor;
locating said at least two reduced sized model antennas on said reduced sized model;
measuring a second coupling loss between said at least two reduced sized model antennas while located on said reduced sized model;
separately measuring gains of each of said at least two reduced sized model antennas while each is independently installed at an identical fixed-point location on an antenna ranges turn table which is setup at a distance away from an antenna ranges calibrated source;
separately measuring gains of each of said at least two antennas while each is independently installed at said identical fixed-point location on said antenna ranges turn table setup at said distance away from said antenna ranges calibrated source; and
approximating said first coupling loss between said at least two antennas while on the structure by adding each of said separately measured gains of each of said at least two antennas to said second coupling loss and subtracting each of said separately measured gains of each of said at least two reduced sized model antennas.

20. The method of claim 19 wherein said structure is at least one of a vehicle and an aircraft.

21. The method of claim 19 wherein the step of locating said at least two reduced sized model antennas on said reduced sized model comprises determining locations of said at least two antennas on said structure and dividing said locations by said scaling factor.

22. The method of claim 19 wherein a network analyzer is used to measure said second coupling loss.

23. The method of claim 19 wherein said second coupling loss is measured from a start frequency to a stop frequency, during the step of separately measuring the gains of each of said at least two reduced sized model antennas the measurements are taken from said same start frequency to said same stop frequency, and during the step of separately measuring the gains of each of said at least two antennas the measurements are taken from said start frequency divided by the scaling factor to said stop frequency divided by the scaling factor.

* * * * *